United States Patent
Yano

(10) Patent No.: US 7,812,360 B2
(45) Date of Patent: Oct. 12, 2010

(54) LIGHT EMITTING DEVICE, LIGHTING EQUIPMENT OR LIQUID CRYSTAL DISPLAY DEVICE USING SUCH LIGHT EMITTING DEVICE

(75) Inventor: Keiichi Yano, Yokohama (JP)

(73) Assignees: Kabushiki Kaisha Toshiba, Tokyo (JP); Toshiba Materials Co., Ltd., Yokohama-shi (JP)

( * ) Notice: Subject to any disclaimer, the term of this patent is extended or adjusted under 35 U.S.C. 154(b) by 513 days.

(21) Appl. No.: 11/576,533

(22) PCT Filed: Sep. 30, 2005

(86) PCT No.: PCT/JP2005/018083
§ 371 (c)(1), (2), (4) Date: Apr. 3, 2007

(87) PCT Pub. No.: WO2006/038543
PCT Pub. Date: Apr. 13, 2006

(65) Prior Publication Data
US 2007/0247855 A1 Oct. 25, 2007

(30) Foreign Application Priority Data
Oct. 4, 2004 (JP) .............................. 2004-291608

(51) Int. Cl.
H01L 33/00 (2010.01)
(52) U.S. Cl. .......................... 257/98; 257/99; 257/100; 257/E33.072; 257/E33.075
(58) Field of Classification Search .................. 257/98, 257/99, 100, E33.057, E33.072, E33.075; 349/65
See application file for complete search history.

(56) References Cited

U.S. PATENT DOCUMENTS

| | | | |
|---|---|---|---|
| 5,714,801 A | 2/1998 | Yano et al. | |
| 5,909,058 A | 6/1999 | Yano et al. | |
| 6,046,499 A | 4/2000 | Yano et al. | |
| 6,498,355 B1 | 12/2002 | Harrah et al. | |

(Continued)

FOREIGN PATENT DOCUMENTS
CN 2419463 Y 2/2001

(Continued)

OTHER PUBLICATIONS
U.S. Appl. No. 10/572,595, filed Oct. 24, 2006, Yano.

*Primary Examiner*—Minh-Loan T Tran
(74) *Attorney, Agent, or Firm*—Oblon, Spivak, McClelland, Maier & Neustadt, L.L.P.

(57) ABSTRACT

A light emitting apparatus 11 comprises: an aluminum nitride co-fired substrate 13; at least one light emitting device 15 mounted on a front surface of the co-fired substrate 13 through a flip-tip method; and a reflector 16 having an inclined surface 14 for reflecting a light emitted from the light emitting device 15 to a front side direction, the reflector 16 is bonded to a surface of the aluminum nitride co-fired substrate 13 so as to surround a circumference of the light emitting device 15. This configuration can simplify the process of manufacturing the apparatus and can provide light emitting apparatus that are excellent in heat radiation performance, allow a larger current to pass therethrough, and can have a significantly increased luminance with a high luminous efficiency.

8 Claims, 1 Drawing Sheet

U.S. PATENT DOCUMENTS

| | | |
|---|---|---|
| 6,936,855 B1 * | 8/2005 | Harrah ............... 257/88 |
| 6,949,772 B2 * | 9/2005 | Shimizu et al. ......... 257/99 |
| 2004/0041222 A1 | 3/2004 | Loh |
| 2004/0169466 A1 * | 9/2004 | Suehiro et al. ......... 313/512 |
| 2004/0188696 A1 * | 9/2004 | Hsing Chen et al. ...... 257/99 |

FOREIGN PATENT DOCUMENTS

| | | |
|---|---|---|
| EP | 1 605 524 A1 | 12/2005 |
| EP | 1 670 073 A1 | 6/2006 |
| JP | 9-293904 | 11/1997 |
| JP | 10 12779 | 1/1998 |
| JP | 10-279377 | 10/1998 |
| JP | 2002 353515 | 12/2002 |
| JP | 2003 192442 | 7/2003 |
| JP | 2004 87796 | 3/2004 |
| JP | 2004-228413 | 8/2004 |
| JP | 2004 241509 | 8/2004 |
| JP | 2005 150408 | 6/2005 |
| JP | 2005 210042 | 8/2005 |
| WO | WO 2004/084319 A1 | 9/2004 |

* cited by examiner

LIGHT EMITTING DEVICE, LIGHTING EQUIPMENT OR LIQUID CRYSTAL DISPLAY DEVICE USING SUCH LIGHT EMITTING DEVICE

TECHNICAL FIELD

The present invention relates to a light emitting apparatus, a lighting apparatus (interior illumination) and a liquid crystal display including light emitting devices such as light emitting diodes (LEDs) or semiconductor laser arranged on surfaces of insulating substrates. More specifically, the present invention relates to a light emitting apparatus, a lighting apparatus and a liquid crystal display using the light emitting apparatus that can be manufactured through a simple process, can be reduced in size, are excellent in heat radiation performance, allow a larger current to pass therethrough, and can have a significantly increased luminance (luminescence) with a high luminous efficiency.

BACKGROUND ART

Light emitting diodes (hereinafter also referred to as LED chips) are light emitting devices (light emitting elements) that act as light sources upon application of a voltage and utilize light emitted as a result of recombination between electrons and positive holes in the vicinity of a contact surface (pn-junction) between two semiconductors. These light emitting devices are small in size and have a high conversion efficiency of electric energy into light, and therefore these light emitting devices are widely used as household electrical appliances, interior illuminations, lighted operation switches, and LED indicators (LED displays).

Differing from electric lamp bulbs using filaments, the light emitting diodes are semiconductor devices, are thereby free from blowout, are excellent in initial drive performance, and have excellent durability even under vibrations and/or repeated ON/OFF operations. They are therefore also used as backlights of indicators or displays typically for automobile dashboards. Particularly, since they can emit light of a clear color with high color saturation without being affected by sunlight, the uses of the light emitting diodes will be expanded even to, for example, displays arranged outdoor, displays for traffic use, and traffic signals, or the like.

As conventional light emitting apparatuses mounted with light emitting devices such as LED chips, for example, there is proposed a light emitting apparatus shown in FIG. 2 (see, for example, Patent Document (Japanese Patent No. 3,316,838)). The light emitting apparatus 1 comprises a ceramic package 3, a LED chip as a light emitting device, a first metal layer 6, a second metal layer 7, and a resin molding 8. The ceramic package 3 includes conductive interconnections (conduction wirings) 2 and has a number of concave openings integrally formed to the ceramic package. The LED chip 5 is electrically connected to the conductive interconnections 2 via bonding wires 4 in the concave opening. The first metal layer 6 and the second metal layer 7 are arranged on a side wall of the concave opening. The resin molding 8 seals the concave opening.

The patent document mentions that, according to the conventional light emitting device, the first metal layer 6 arranged in the concave opening acts to increase the adhesion with the ceramic package 3, and, additionally, the second metal layer 7 acts to reflect light emitted from the LED chip 5, whereby the light loss can be reduced and the contrast typically in displays can be increased.

The conventional light emitting apparatus, however, has a fatal defect of very poor heat radiation performance, since the ceramic package mounted with the LED chip comprises a ceramic material mainly composed of alumina ($Al_2O_3$) having a low thermal conductivity of about 15 to 20 W/mK, and the molding resin for sealing the LED chip also has a low thermal conductivity. The LED chip may be broken due to heat generated upon application of a high voltage and/or a large current. Consequently, there has been raised a problem that the conventional light emitting apparatus has a low luminance, since the highest voltage that can be applied to the LED chip is low and the current to be supplied is limited to several ten milliamperes (mA).

In this connection, in the above conventional light emitting apparatus, since the luminance to be technically demanded was low, the conventional light emitting apparatus using a LED chip has been practically used without significant problems even at the above-mentioned current quantity. However, with recent expanding specific uses (application field) of LED light emitting apparatuses, technical demands have been made to achieve structures that can increase the current to be passed to about several amperes at a higher power and can thereby increase the luminance.

Further, in the above conventional light emitting apparatus, the ceramic package integrally formed with a number of concave openings for accommodating the light emitting elements is used, so that there has been posed problems such that a process of manufacturing the light emitting apparatus becomes complicate, and finished accuracy of parts constituting the apparatus is low whereby a sufficient emission property (light emitting property) cannot be obtained. That is, a working operation for integrally forming the number of the concave openings to a hard and brittle ceramic material was an extremely difficult, so that a great working expense and processing charge were required.

On the other hand, in a case where the number of the concave openings were integrally formed to a ceramic member by drilling work at a stage of soft molded body and then the molded body was sintered, a dimension accuracy, a finishing accuracy and a dispersion of surface roughness of the concave openings were disadvantageously deteriorated due to shrinkage error and non-uniformity in material composition, whereby there was posed a problem that an aimed light-reflecting property could not be obtained.

A side surface of the concave opening for accommodating the above light emitting element functions as a reflector for reflecting the emitted light. Since this reflector is integrally formed to the ceramic substrate, a surface roughness Ra of an inner wall surface of the reflector becomes coarse to be about 0.5 µm, so that there was also posed a problem that a scattering and dispersion of the light was liable to occur.

In addition, even if a predetermined inclined angle was tried to be imparted to the inner wall of the reflector so as to control a reflecting direction of the light, a fluctuation or a dispersion of the inclined angle was large, so that it was difficult to stably impart a predetermined inclined angle. At any rate, it was difficult to correctly control the shape accuracy of the concave openings. Furthermore, even if a worker tried to work and adjust the reflector so as to realize a predetermined finishing accuracy, the ceramic material having hard and brittle properties was difficult to be smoothly worked, so that there was also posed a problem that a man-hour required for the working was greatly increased.

Additionally, in conventional light emitting apparatuses as shown in FIG. 2, the LED chip and the conductive interconnections are electrically connected by a wire bonding process, so that the wire and an electrode pad disposed on the LED chip partially block or intercept the emitted light, whereby there was also posed a problem that a light-extraction efficiency was decreased.

Further, a portion where the bonding wire rises protrudes in a thickness direction of the apparatus, and a large electrode region for connecting the edge of the bonding wire is disadvantageously required. Thus, there has been posed a problem that the LED package including the interconnection structure becomes large in size.

Furthermore, when the LED chip is mounted and accommodated in a concave opening as shown in FIG. 2 so as to avoid the adverse influence of the bonding wire protruding in a thickness direction of the apparatus, the light emitted from the LED chip is absorbed by the inner wall of the concave opening to increase the light loss and thereby to decrease the luminous efficiency. Thus, according to the conventional technique, two metal layers that reflect light are arranged on the inner wall of the respective concave openings to thereby reduce the absorption loss of the light.

However, it is very difficult to form such a reflecting metal layer uniformly in the concave opening having a curved inner wall, and the emitted light is partially absorbed by the inner wall to invite light loss. In addition, there has been also posed another problem that the inner wall of the concave opening itself has such a structure as to inhibit the travel or transmission of the light, and the luminance is thereby decreased.

DISCLOSURE OF INVENTION

The present invention has been achieved to solve the above conventional problems, and an object of the present invention is to provide a light emitting apparatus that can be manufactured through a simple process, is excellent in heat radiation performance, allows a larger current to pass therethrough, and can have a significantly increased luminance with a high luminous efficiency.

To achieve the above object, the present invention provides a light emitting apparatus comprising: an aluminum nitride co-fired substrate; at least one light emitting devices mounted on a front surface of the co-fired substrate through a flip-tip method; and a reflector (light reflecting body) having an inclined surface for reflecting a light emitted from the light emitting devices to a front side direction, the reflector being bonded to a surface of the aluminum nitride co-fired substrate so as to surround a circumference of the light emitting devices.

In the above light emitting apparatus, the apparatus is preferably configured such that the aluminum nitride co-fired substrate is arranged with a printed wiring board at a rear surface of the aluminum nitride co-fired substrate, and a wiring of the printed wiring board is connected to an electrode provided to an outer peripheral portion of the rear surface of the aluminum nitride co-fired substrate, so that current (driving power) is supplied from the printed wiring board to the light emitting device through internal wiring layer formed in the aluminum nitride co-fired substrate.

Further, in the above light emitting apparatus, it is preferable that the printed wiring board comprises a through hole at immediately below the aluminum nitride co-fired substrate, and a heat sink having a raised portion fitted into the through hole is tightly bonded to the rear surface of the aluminum nitride co-fired substrate.

Furthermore, in the above light emitting apparatus, it is also preferable that a surface of the aluminum nitride co-fired substrate onto which the light emitting device is mounted is mirror-polished so as to have a surface roughness Ra of 0.3 µm or less.

Still furthermore, in the above light emitting apparatus, it is also preferable that the inclined surface of the reflector is formed with a metal film composed of aluminum (Al) or silver (Ag).

The lighting apparatus of the present invention comprises: an apparatus body; above-mentioned light emitting apparatus arranged in the apparatus body; and a turning-on device, provided in the apparatus body, for turning on or turning off the lighting apparatus.

The liquid crystal display of the present invention comprises: a liquid crystal display body; and afore-mentioned light emitting apparatus arranged in the liquid crystal display body.

Specifically, the light emitting apparatus according to the present invention uses an aluminum nitride (AlN) co-fired substrate or a metallized AlN substrate having a high thermal conductivity as a ceramic substrate (LED package) for mounting a LED chip. In the co-fired aluminum nitride (AlN) substrate, inner wiring layers are formed. As the co-fired AlN substrate, it is preferable to use AlN substrate having a high thermal conductivity of 170 W/m·K or more.

In particular, by using an aluminum nitride substrate having a high thermal conductivity, the light emitting apparatus can have a significantly increased heat radiation performance and an increased critical current quantity for the light emitting device, thereby allows a large current to pass therethrough, and can thereby have a significantly increased luminance.

The afore-mentioned reflector (light reflecting body) is formed with an inclined surface for reflecting the light emitted from a light emitting element toward the front side direction, and is formed of metal materials such as Kovar alloy, copper (Cu) or the like or resin materials such as ABS resin or the like. This reflector is not integrally formed with an AlN substrate body but separately formed from metal or resin material as independent parts. Thereafter, the reflector as the independent part is bonded to a surface of the aluminum nitride substrate so as to surround a circumference of the light emitting element.

Accordingly, it becomes possible to accurately control a coarse degree of the finished surface, dimension (size), inclination angle of the light-reflecting plane or the like of the reflector with a high accuracy, whereby the reflector having an excellence in light-reflecting property can be mass-produced through a simple manufacturing process. In particular, the inner wall surface (inclined surface) of the reflector can be easily mirror-polished, so that the inclined angle of the inclined surface can be also controlled with a high accuracy.

Further, the aluminum nitride substrate is arranged with a printed wiring board at a rear surface of the aluminum nitride substrate, and a wiring of the printed wiring board is connected to an electrode pad provided to an outer peripheral portion of the rear surface of the aluminum nitride substrate, so that current is supplied from the printed wiring board to the light emitting device through internal wiring layer formed in the aluminum nitride substrate. Due to the above configuration, the wiring layers and electrodes are not provided to a front side (light irradiating direction) of the light emitting element, so that a light-blocking would be eliminated thereby to increase the luminance.

Furthermore, the apparatus has a structure in which the light emitting element is mounted onto the surface of the co-fired substrate composed of aluminum nitride by using a flip-chip method, a current-carrying operation to the light emitting element is performed from the electrode formed to the rear-side surface of the aluminum nitride substrate toward the light emitting element provided to the front-side of the substrate through the inner wiring layers.

Due to the above structure, there is no need to connect the wirings at the front-side surface of the AlN substrate by using a wire-bonding method, so that a wiring structure can be simplified. In addition, a protrusion of the bonding wire in a thickness direction is not formed at all, so that the light emitting apparatus can be compactly formed with a small size.

Still further, the printed wiring board comprises a through hole at immediately below the aluminum nitride substrate, and a heat sink having a raised portion to be fitted into the through hole is tightly bonded to the rear surface of the aluminum nitride substrate.

Due to the above structure, a heat generated from the light emitting element can be rapidly transmitted and radiated toward the heat sink through the aluminum nitride substrate. Accordingly, the function of the heat sink and the heat conductive effect of the AlN substrate having a high thermal conductivity work synergistically in greatly increasing the heat radiating property of the light emitting apparatus.

Further, when the surface of the AlN substrate mounting the light emitting device is mirror-polished, the reflectivity at the polished surface increases, and light emitted from the joint surface of the light emitting device can be effectively reflected toward the front-side surface of the AlN substrate. Thus, the emission intensity (luminance) can be substantially increased. The surface roughness of the mirror-polished surface is set at 0.3 μm Ra or less in terms of the arithmetic average roughness (Ra) specified in Japanese Industrial Standards (JIS B 0601). If the surface is roughened so as to have a surface roughness exceeding 0.3 μm Ra, a diffused reflection and/or an absorption of the emitted light on the polished surface tends to occur, and the emission intensity tends to decrease. The surface roughness of the mirror-polished surface is therefore set at 0.3 μm Ra or less. By setting the surface roughness at 0.1 μm Ra or less, the reflectivity of emitted light can further be increased.

Additionally, when the metal film composed of aluminum (Al) or silver (Ag) is formed onto the inclined surface of the reflector for reflecting the light emitted from the light emitting element by utilizing a vapor depositing method or a plating method, the emission intensity in front-side direction of the light emitting apparatus can be increased.

In particular, when a vapor-deposited metal film, which has a reflectivity of 90% or more with respect to light emitted from the light emitting device, is arranged on the inclined surface, the light emitted from the side surface of the light emitting device can be effectively reflected by the vapor-deposited metal film and be inverted to direct to the front side of the substrate, and the emission intensity (luminance) toward the front side of the AlN substrate can further be increased.

As the vapor-deposited metal film having a reflectivity of 90% or more, a metal film composed of aluminum (Al) or silver (Ag) is preferably used. These vapor-deposited metal films may be formed so as to have a thickness of about 1 to 5 μm, preferably 1 to 3 μm, typically by utilizing chemical vapor deposition (CVD) method or sputtering method. The above reflectivity is defined as a ratio of the emission intensity of the reflected light to the emission intensity of the incident light.

Further, in the above light emitting apparatus, when the inner wiring layers or via holes are arranged which penetrates the aluminum nitride substrate from the front surface mounting the light emitting device to the rear surface so as to secure an electrical connection to the light emitting device from the rear surface of the substrate, it becomes possible to mount the light emitting device onto the aluminum nitride substrate by using the flip-chip method. As described above, when the light emitting device is mounted and connected to the aluminum nitride substrate by the flip-chip method, an electrode plate or the like can be eliminated, so that the emitted light can be extracted from an entire rear surface of the light emitting device. In addition, a spacing pitch between the adjacent light emitting devices can be narrowed, so that a mounting density of the light emitting devices can be increased and the light emitting apparatus can thereby be reduced in thickness and size.

More concretely to say, interconnection (wiring) can be conducted in accordance with a face down system in which metal bumps such as solder bumps are formed on connection ends (connecting terminals) of the light emitting device such as a LED chip, and the bumps are connected to an energizing interconnection arranged on the rear surface of the substrate via the via holes and lands arranged on ends of interconnecting conductors. According to the above interconnection structure by the face down system, electrodes can be taken out at arbitrary positions of the surface of the light emitting device. This structure allows the connection between the light emitting device and the interconnection conductor at a shortest distance, inhibits the LED chip as the light emitting device from increasing in size even with an increased number of electrodes, and enables the mounting of the LED chip in a very small thickness.

Effects of the Invention

According to the light emitting apparatus having the above configuration, since an aluminum nitride (AlN) co-fired substrate having a high thermal conductivity is used as a substrate (LED package) for mounting a LED chip, the apparatus can have significantly increased heat radiation performance and increased critical currents, thereby allow a large current to pass therethrough, and can have significantly increased luminance.

In addition, the reflector used in the present invention is not integrally formed with an AlN substrate body but separately formed from metal or resin material as independent parts. Thereafter, the reflector is bonded to a surface of the aluminum nitride substrate. Accordingly, the parts can be easily worked at the stage of a part, so that it becomes possible to accurately control a coarse degree of the finished surface, dimension (size), inclination angle of the light-reflecting plane or the like of the reflector with a high accuracy, whereby the reflector having an excellence in light-reflecting property can be obtained and the light-extraction efficiency can be increased.

Furthermore, the light emitting device is mounted and connected to the AlN substrate by the flip-chip method, so that the emitted light can be extracted from an entire rear surface of the light emitting device. In addition, a spacing pitch between the adjacent light emitting devices can be narrowed, so that a mounting density of the light emitting devices can be increased and the light emitting apparatus can thereby be reduced in thickness and size.

BEST MODE FOR CARRYING OUT THE INVENTION

Next, embodiments of the light emitting apparatuses according to the present invention will be explained and illustrated in more detail with reference to the attached drawings and the following Examples.

Example 1

FIG. 1 is a sectional view showing an embodiment of the light emitting apparatus according to the present invention. Namely, the embodiment of the light emitting apparatus 11 is configured to comprise: an aluminum nitride co-fired substrate (AlN multi-layered substrate) 13; three LED chips 15 as light emitting devices mounted on a front surface of the co-fired AlN substrate through a flip-tip method; and a reflector 16 composed of kovar having an inclined surface 14 for reflecting a light emitted from the LED chips 15 as light emitting devices to a front side direction, the reflector 16 being solder-bonded to a surface of the aluminum nitride co-fired substrate 13 so as to surround a circumference of the LED chips 15.

As the above co-fired substrate (AlN multi-layered substrate) 13, a co-fired AlN multi-layered substrate having a high thermal conductivity of 200 W/m·K, a two-layered structure and a size of 5 mm-length×5 mm-width×0.5 mm-thickness, was used.

Further, the aluminum nitride substrate 13 is arranged with a printed wiring board 19 at a rear surface of the aluminum nitride substrate 13, and a wiring of the printed wiring board 19 is connected to an electrode pad 17 provided to an outer peripheral portion of the rear surface of the aluminum nitride substrate 13. An electrode pad for flip-tip connection is formed to a front surface side of the aluminum nitride substrate 13. This electrode pad is electrically connected to an inner wiring layer 12 of the aluminum nitride substrate 13 through via hole.

The inner wiring layer 12 is drawn from an electrode pad formed at a center portion of the AlN substrate 13 to an outer peripheral portion of the AlN substrate 13. An electrode pad 17 for connecting the printed wiring board 19 is formed to an outer peripheral portion of the rear surface of the AlN substrate 13. On the electrode pads for flip-tip connection provided on the surface of the aluminum nitride substrate 13, there are formed with bumps composed of Au, Al or solder. The LED chips are bonded onto the AlN substrate 13 through these bumps.

The printed wiring board 19 is formed with a wiring at a portion corresponding to a position of the electrode pad formed to an outer peripheral portion of the rear surface of the AlN substrate 13, and the above wiring is solder-bonded to an electrode portion of the AlN substrate 13. Thus, the apparatus is configured so that an electric power is supplied from the printed wiring board 19 to LED chips 15 through the electrode pad 17, the via hole and the internal wiring layer 12.

Further, the printed wiring board 19 comprises a through hole 20 at immediately below the aluminum nitride substrate 13, and the rear surface of the aluminum nitride substrate 13 is exposed to the through hole 20. A copper-made heat sink 21 having a raised portion 21a to be fitted into the through hole 20 is tightly bonded to the rear surface of the aluminum nitride substrate 13 through a heat radiating grease or a solder. A fluorescent material (phosphor) 22 and a molding resin 18 are filled into an inner space of the reflector 16 and a space above the LED chips 15. The fluorescent material 22 emits a light having a specified wavelength upon absorbing a light emitted from the LED chips 15.

In the light emitting apparatus configured as above, when the electric power is supplied from the printed wiring board 19 to LED chips 15 through the electrode pad 17, the via hole and the internal wiring layer 12, the LED chips 15 emit lights. Then, these lights are radiated to the phosphor 22, so that a light having a specified wavelength is emitted.

At this time, the light emitted from a side surface of the LED chip 15 is reflected at the inclined surface 14 of the reflector 16. Then, the reflected light is radiated toward a front-side direction.

In a case where the surface of the aluminum nitride substrate 13 onto which the LED chips 15 are mounted is mirror-polished so as to have a surface roughness Ra of 0.3 μm or less, a light emitted in a rear side direction of the LED chip 15 is reflected at the surface of the aluminum nitride substrate 13. As a result, a luminance of the light radiated in a front side direction of the light emitting apparatus 11 can be increased.

On the other hand, a heat radiated from the heat-generated LED chips 15 can be rapidly conducted and transmitted to the heat sink 21 through the aluminum nitride substrate 13. Accordingly, a heat radiating property of the light emitting apparatus 11 can be greatly increased in synergistic with a heat-conducting effect of the AlN substrate 13 having a high thermal conductivity.

In this connection, in the present embodiment, since the reflector 16 is formed of kovar alloy, the inclined surface 14 can be remarkably smoothly formed, so that the inclined surface 14 has a sufficient light-reflecting function. However, when a metal film composed of silver (Ag) or aluminum (Al) is formed to this inclined surface 14 by a chemical vapor deposition method or the like, the light-reflecting property at the reflector 16 can be further improved.

According to the light emitting apparatus 11 of this embodiment, since an aluminum nitride (AlN) co-fired substrate 13 having a high thermal conductivity is used as a substrate (LED package) for mounting a LED chip 15, the apparatus 11 can have significantly increased heat radiation performance and increased critical currents (applicable maximum current quantity), thereby allow a large current to pass therethrough, and can have significantly increased luminance.

In addition, the reflector 16 is not integrally formed with an AlN substrate body but separately formed as independent parts. Thereafter, the reflector 16 is bonded to a surface of the aluminum nitride substrate 13. Accordingly, the parts can be easily worked at the stage of a part, so that it becomes possible to accurately control a coarse degree of the finished surface, dimension (size), inclination angle of the inclined surface (light-reflecting plane) 14 or the like of the reflector 16 with a high accuracy, whereby the reflector 16 having an excellence in light-reflecting property can be obtained and the light-extraction efficiency can be increased.

Furthermore, LED chip 15 as the light emitting device is mounted and connected to the AlN substrate 13 by the flip-chip method, so that the emitted light can be extracted from an entire rear surface of the LED chip 15. In addition, a spacing pitch between the adjacent LED chips 15 can be narrowed, so that a mounting density of the LED chips 15 can be increased and the light emitting apparatus 11 can thereby be reduced in thickness and size.

Further, the aluminum nitride substrate 13 is arranged with a printed wiring board 19 at a rear surface of the aluminum nitride substrate 13 and a wiring of the printed wiring board 19 is connected to an electrode pad 17 provided to an outer peripheral portion of the rear surface of the aluminum nitride substrate 13, and the apparatus is configured so that an electric power is supplied from the printed wiring board 19 to LED chips 15 through the internal wiring layer 12. Due to this configuration, wiring layers and electrodes are not provided to a front side portion of the LED chips 15. Therefore, blocking of the emitted light by the wiring layers and electrodes can be eliminated, so that the luminance of the emitted light can be increased.

Furthermore, the apparatus 11 has a structure in which the LED chip 15 is mounted onto the surface of the co-fired substrate 13 composed of aluminum nitride by using a flip-chip method, a current-carrying (power supplying) operation to the LED chip 15 is performed from the electrode pad 17 formed to the rear-side surface of the aluminum nitride substrate 13 toward the LED chip 15 provided to the front-side of the substrate 13 through the inner wiring layers 12.

Due to the above structure, there is no need to connect the wirings at the front-side surface of the AlN substrate 13 by using a wire-bonding method, so that a wiring structure can be simplified. In addition, a protrusion of the bonding wire in a thickness direction is not formed at all, so that the light emitting apparatus 11 can be compactly formed with a small thickness and size.

Still further, the printed wiring board 19 comprises a through hole 20 at an immediately below the aluminum nitride substrate 13, and a heat sink 21 having a raised portion 21a to be fitted into the through hole 20 is tightly bonded to the rear surface of the aluminum nitride substrate 13.

Due to the above structure, a heat generated from the LED chip 15 can be rapidly conducted and transmitted toward the heat sink 21 through the aluminum nitride substrate 13. Accordingly, the function of the heat sink 21 and the heat conductive effect of the AlN substrate 13 having a high thermal conductivity work synergistically in greatly increasing the heat radiating property of the light emitting apparatus 11.

Example 2

The same manufacturing process as in Example 1 was repeated except that a metal film 23 composed of silver (Ag) and having a thickness of 2 μm was formed onto the inclined surface 14 of the reflector 16 shown in FIG. 1, thereby to prepare a light emitting apparatus of Example 2.

Example 3

The same manufacturing process as in Example 1 was repeated except that the heat sink 21 shown in FIG. 1 was not attached, thereby to prepare a light emitting apparatus of Example 3.

Example 4

The same manufacturing process as in Example 1 was repeated except that a plate-shaped heat sink 21 having no raised portion 21a shown in FIG. 1 was bonded to the AlN substrate 13 through a printed wiring board having no through hole, thereby to prepare a light emitting apparatus of Example 4.

With respect to ten apparatuses according to each of the above Examples 1-4, heat resistance, LED maximum current quantity within a range where the LED chip stably emits light without breakage was determined while the quantity of current to be fed and applied to each of the LED chips was gradually increased, and the heat resistance, the maximum current quantities and the luminance of the respective light emitting apparatuses were measured. The results of average values are shown in Table 1 hereunder.

TABLE 1

| Sample No. | Heat Resistance (° C./w) | LED Applicable Maximum Current Quantity (mA) | Luminance (Lm) |
|---|---|---|---|
| Example 1 | 1.1 | 1100 | 9.8 |
| Example 2 (With Metal Film) | 1.1 | 1100 | 11.5 |
| Example 3 (Without Heatsink) | 20 | 98 | 0.9 |
| Example 4 (Simply Laminated Type) | 19 | 112 | 1.2 |

As is clear from the results shown in Table 1, according to the light emitting apparatus of Example 2 in which the metal film 23 composed of silver (Ag) was formed onto the inclined surface 14 of the reflector 16, the reflection ratio (reflectivity) of the light at the inclined surface 14 was increased. As a result, it was evidenced that the luminance was improved by 10 to 20% in comparison with the apparatus of Example 1.

Further, in case of the light emitting apparatus of Example 3 in which the heat sink 21 was not attached, the heat resistance value was disadvantageously increased to be 18 times larger than those of Examples 1-2, and LED maximum current quantity and heat resistance were relatively lowered.

On the other hand, according to the light emitting apparatus of Example 4 in which the plate-shaped heat sink 21 having no raised portion 21a was laminated to the AlN substrate 13 through the plate-shaped printed wiring board having no through hole, the heat sink was not directly contacted to the AlN substrate 13, so that the heat resistance was increased to be large and the luminance was relatively lowered.

Example 5

Each of the light emitting apparatuses of Examples 1-2 was assembled into a lighting apparatus body, then a turning-on device for turning on or turning off the lighting apparatus was provided in the apparatus body as indicated in FIG. 3, where a turning-on device, 24, lighting apparatus body, 25, and liquid crystal display body, 26 are shown, thereby to prepare the respective lighting apparatuses of Example 5. Each of the light emitting apparatuses had an excellent heat radiating property, and it became possible to apply a larger current (LED maximum current quantity) to the apparatuses. It was confirmed that the light emitting efficiency could be increased and the luminance could be remarkably increased.

In this connection, when a plurality of the light emitting apparatuses shown in FIG. 1 are arranged to form a row in a longitudinal direction or in a lateral direction, a linear-light emitting source can be obtained. On the other hand, when the plurality of the light emitting apparatuses were arranged in all directions to form a two-dimensional array, an area-light emitting source could be effectively obtained.

Example 6

Each of the light emitting apparatuses of Examples 1-2 as a back light was provided into a liquid crystal display (LCD) body, thereby to assemble the respective liquid crystal displays of Example 6. Each of thus prepared liquid crystal displays of Example 6 structurally includes the aluminum nitride (AlN) substrate excellent in heat radiating property as a substrate for constituting the light emitting apparatus, so that it became possible to apply a larger current (LED maximum current quantity) to the apparatuses. It was confirmed that the light emitting efficiency could be increased and the brightness of the liquid crystal display could be remarkably increased.

In this regard, although the present invention had been explained by taking examples in which the multi-layered AlN substrate having a thermal conductivity of 200 W/m·K was used, the present invention is not limited thereto. When AlN substrate having a thermal conductivity of 170 W/m·K or 230 W/m·K was used, there could be also obtained both an excellent heat radiating property and an excellent light emitting property. Concretely, when AlN substrate having a thermal conductivity of 200 W/m·K or 230 W/m·K was used, the heat resistance was reduced by 20-30%, the critical currents (maximum passable current or applicable maximum current quantity) and the luminance could be increased by 20-30% in comparison with a case where AlN substrate having a thermal conductivity of 170 W/m·K was used.

INDUSTRIAL APPLICABILITY

As described above, according to the light emitting apparatus of the present invention adopts an aluminum nitride (AlN) co-fired substrate having a high thermal conductivity as a substrate (LED package) for mounting the LED chip. Thus, the heat radiation performance of the light emitting apparatus significantly increases, so that the critical current (applicable maximum current quantity) increases thereby to allow a large current to pass through the LED chips, and the luminance can be significantly increased.

In addition, the reflector used in the present invention is not integrally formed with the AlN substrate body but separately formed as independent parts. Thereafter, the reflector is bonded to a surface of the aluminum nitride substrate. Accordingly, the parts can be easily worked at the stage of a part, so that it becomes possible to accurately control a coarse degree of the finished surface, dimension (size), inclination angle of the light-reflecting plane or the like of the reflector with a high accuracy, whereby the reflector excellent in light-reflecting property can be obtained and the light-extraction efficiency can be greatly increased.

Furthermore, the light emitting device is mounted and connected to the AlN substrate by the flip-chip method, so that the emitted light can be extracted from an entire rear surface of the light emitting device. In addition, a spacing pitch between the adjacent light emitting devices can be narrowed, so that a mounting density of the light emitting devices can be increased and the light emitting apparatus can thereby be reduced in thickness and size.

Figure 1:
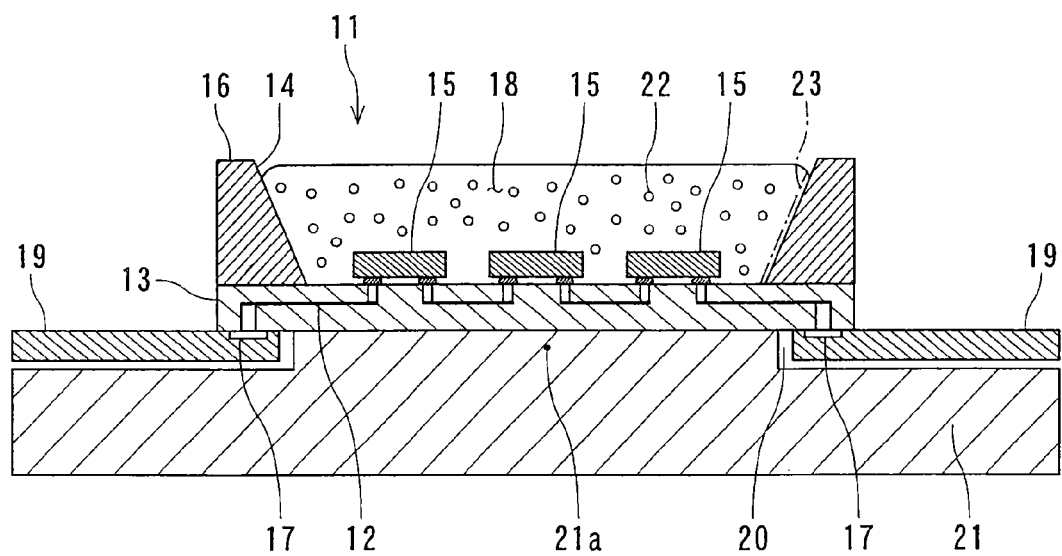
FIG. 1 is a sectional view showing an embodiment of the light emitting apparatus according to the present invention.
Figure 2:
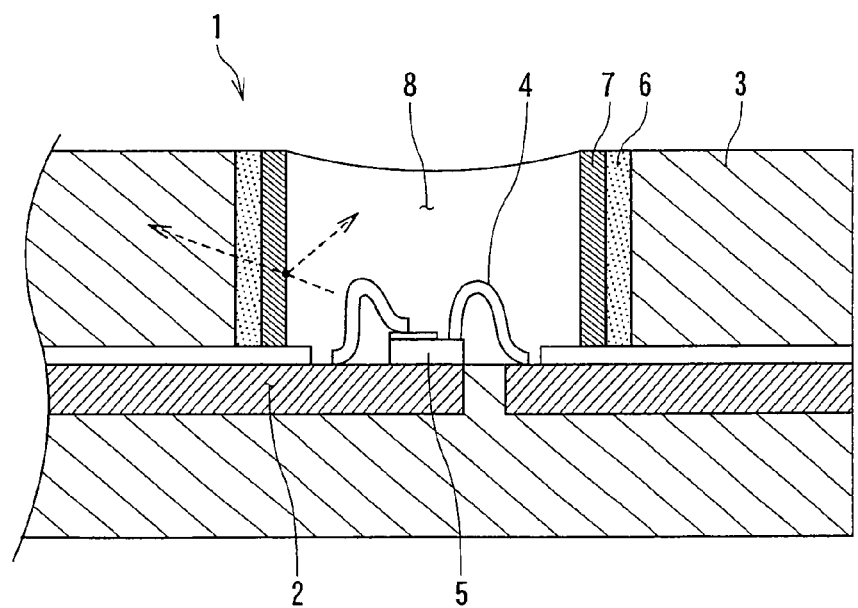
FIG. 2 is a sectional view showing an example of the configuration of a conventional light emitting apparatus.

The invention claimed is:

1. A light emitting apparatus, comprising:
an aluminum nitride co-fired substrate provided with an inner wiring layer which penetrates the aluminum nitride substrate from the front surface to the rear surface;
at least one light emitting device mounted on a front surface of the co-fired substrate through a flip-tip method;
a reflector having an inclined surface for reflecting a light emitted from the light emitting device to a front side direction, said reflector surface being a metal film and said reflector being bonded to a surface of said aluminum nitride co-fired substrate so as to surround a circumference of said light emitting device;
a printed wiring board at a rear surface of said aluminum nitride co-fired substrate; and
an electrode on an outer peripheral portion of the rear surface of said aluminum nitride co-fired substrate;
wherein
said printed wiring board comprises a through hole at immediately below said aluminum nitride co-fired substrate, and a heat sink having a raised portion fitted into said through hole is tightly bonded to the rear surface of said aluminum nitride co-fired substrate
a current carrying operation to the light emitting device is performed through the inner wiring layer without using a wire bonding,
the reflector having an inclined surface is a metal or a resin,
said metal film on the inclined surface of the reflector is composed of aluminum or silver, and
a wiring of the printed wiring board is connected to the electrode, so that current is supplied from said printed wiring board to the light emitting device through the internal wiring layer formed in said aluminum nitride co-fired substrate.

2. The light emitting apparatus according to claim 1, wherein
the surface of said aluminum nitride co-fired substrate onto which said light emitting device is mounted is mirror-polished, and
a surface roughness Ra of the mirror-polished surface is 0.3 μm or less.

3. A lighting apparatus comprising:
a lighting apparatus body;
a light emitting apparatus according to claim 1 or 2 arranged in said lighting apparatus body; and
a turning-on device, provided in said lighting apparatus body, for turning on or turning off said lighting apparatus.

4. A liquid crystal display comprising:
a liquid crystal display body; and
a light emitting apparatus according to claim 1 or 2 arranged in said liquid crystal display body.

5. The light emitting apparatus according to claim 1, wherein a thickness of the metal film composed of aluminum or silver is in a range of from about 1 to 5 μm.

6. The light emitting apparatus according to claim 1, wherein a reflectivity of the metal film reflector is 90% or more.

7. The light emitting apparatus according to claim 1, wherein the reflector having an inclined surface is a Kovar alloy or copper.

8. The light emitting apparatus according to claim 1, wherein the reflector having an inclined surface is an ABS resin.

* * * * *